(12) United States Patent
Tomasini et al.

(10) Patent No.: US 6,545,503 B1
(45) Date of Patent: Apr. 8, 2003

(54) OUTPUT BUFFER FOR DIGITAL SIGNALS

(75) Inventors: Luciano Tomasini, Monza (IT);
Giancarlo Clerici, Vimodrone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/684,157

(22) Filed: Oct. 6, 2000

(30) Foreign Application Priority Data

Oct. 8, 1999 (EP) .............................. 99830634

(51) Int. Cl.[7] .............................. H03K 17/16; H04B 1/10
(52) U.S. Cl. .............................. 326/27; 326/29; 326/83; 327/170; 327/558
(58) Field of Search .............................. 326/26, 27, 82, 326/83, 29; 327/170, 176, 558, 387

(56) References Cited

U.S. PATENT DOCUMENTS

| | | | |
|---|---|---|---|
| 5,041,741 A | 8/1991 | Steele | 307/443 |
| 5,111,076 A | 5/1992 | Tarng | 307/446 |
| 5,489,873 A | * 2/1996 | Kamata et al. | 327/558 |
| 5,543,753 A | * 8/1996 | Williamson | 330/297 |
| 5,805,020 A | * 9/1998 | Danz et al. | 330/10 |
| 6,198,322 B1 | * 3/2001 | Yoshimura | 327/175 |

FOREIGN PATENT DOCUMENTS

| | | |
|---|---|---|
| EP | 0678983 A1 | 10/1995 |
| WO | WO91/20129 | 12/1991 |

* cited by examiner

*Primary Examiner*—Daniel D. Chang

(57) ABSTRACT

A buffer having a circuit for reducing the slope of an input signal and a negative feedback circuit that generates a regulating signal dependent on the variation of the output signal and that applies the regulating signal to the input of the buffer. A precise regulation of the slope, independent of variations in the production process and of environmental conditions, is achieved.

24 Claims, 3 Drawing Sheets

US 6,545,503 B1

OUTPUT BUFFER FOR DIGITAL SIGNALS

TECHNICAL FIELD

The present invention relates to an output buffer for digital signals, and more particularly to an output buffer providing a digital output with edges having shallower slopes than the edges of a digital input signal and the precise setting of the slopes.

BACKGROUND OF THE INVENTION

In some applications of output buffers for digital signals, for example, in data-transmission circuits and in multi-output digital circuits (such as RAMs, ROMs and EEPROMs with microprocessors), two problems in particular have to be addressed.

One of these problems, so-called "ground bouncing," is due to the simultaneous switching of many output stages. In this situation, very high-pulsed currents pass through the parasitic resistances and inductances associated with the electrical connections between the integrated circuit and the external terminals, that is, the interconnection wires and the metal strips of the terminal conductors. These transient currents cause variations in the supply potentials (ground and VDD) which may give rise to spurious internal switching and hence to loss or alteration of the data associated with the digital signal. Another effect of the transient currents is the emission of intense, high-frequency electromagnetic radiation that may interfere with other circuits in the integrated device and that may also be propagated into the surrounding environment, contributing to the emission of potentially harmful radiation.

The other problem relates to the transmission of digital signals on lines outside the integrated circuit. If the line is not perfectly matched, which almost always occurs to a more or less marked extent with wide-band transmission, a very rapid transition between the two levels of the digital signal, that is, a stepped signal with a very steep front, causes a reflected wave. With a high degree of mismatch, the reflected wave may interfere with the signal to the extent of preventing its correct transmission.

A known output buffer that reduces the rate of transition of the output signal is illustrated in FIG. 1. The buffer is constituted by three pairs of complementary MOS transistors (M1$n$, M1$p$; M2$n$, M2$p$; M3$n$, M3$p$), which are connected in a push-pull arrangement between two supply terminals, indicated by the ground symbol and +VDD, and which have their drain electrodes connected together to an output terminal 10. The gate electrode of each transistor is connected to a separate terminal of a generator 11 for generating phase-shifted voltages. The input 12 of the generator is also the input of the buffer.

When, for example, the input signal Vin changes from a low logic state to a high logic state, three signals V1$p$, V2$p$, V3$p$ identical to the input signal Vin but delayed in sequence by a predetermined period of time, and three signals V1$n$, V2$n$, V3$n$ all at the reference (ground) potential, appear at the outputs of the generator. A potential is thus established at the gate electrodes of the p-channel transistors such as to make the transistors M1$p$, M2$p$, M3$p$ conductive one after another whilst the transistors M1$n$, M2$n$, M3$n$ remain non-conductive. An increasing current due to the successive conduction of the transistors M1$p$, M2$p$ and M3$p$ will thus pass through the load (not shown) connected to the output of the buffer and a voltage step with an amplitude of approximately VDD, with a leading edge less steep than that of the input signal Vin will be formed at the output 10. Similarly, a transition of the input signal Vin from a high logic state to a low logic state will bring about successive conduction of the transistors M1$n$, M2$n$ and M3$n$ and hence the formation at the output 10 of a voltage step with an amplitude of approximately VDD, with a trailing edge less steep than that of the input signal Vin.

Although the known arrangement described above is sound in principle, in practice, it can be used only in non-critical applications because the slope of the edges of the output signal cannot be determined with sufficient accuracy at the design stage. This disadvantage is due both to the variability of the parameters of the production process, as a result of which the delay times of the signals to be applied in sequence to the gate electrodes of the transistors cannot be predetermined with certainty, and to the dependence of the parameters which cause the delays on environmental operating conditions (particularly temperature).

SUMMARY OF THE INVENTION

The disclosed embodiment of the present invention provides an output buffer that can provide a digital output signal with edges having shallower slopes than the edges of the digital input signal and in which the slopes can be set precisely.

The foregoing is achieved by the provision of an output buffer that has a slope-variation circuit generating an output signal having transition times longer than an input signal and a negative feedback circuit that generates a regulating signal to the input of the buffer that is dependent on the variation in the output signal.

BRIEF DESCRIPTION OF THE DRAWINGS

The invention will be understood better from the following detailed description of an embodiment thereof described by way of non-limiting example with reference to the appended drawings, in which.

DETAILED DESCRIPTION OF THE INVENTION

Figure 2:
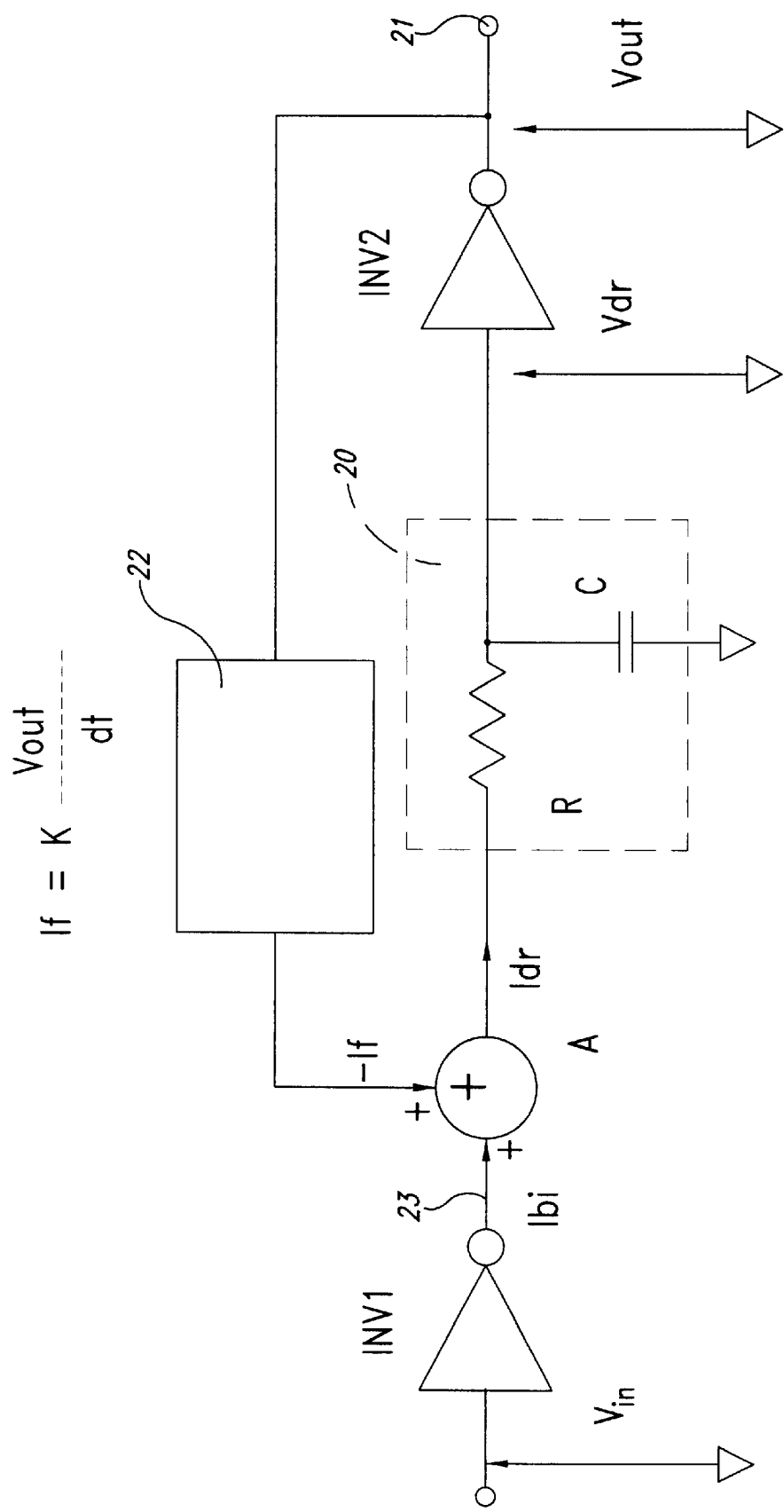
FIG. 2 is a block diagram of an output buffer according to the invention.

The block diagram of a buffer in FIG. 2 shows an inverter INV1 to which a digital input signal Vin is applied and which emits a corresponding output signal in the form of a current Ibi, a current-adding node A which adds a regulating current –If to the current Ibi coming from the inverter INV1, and a low-pass filter 20 which is constituted by a resistor R and by a capacitor C and which receives the current sum Idr as an input and supplies a voltage Vdr to the input of a second inverter INV2. The output 21 of the inverter INV2 is the output of the buffer and is connected to a circuit block 22 which can produce the differential of the output voltage Vout and multiply it by a constant K to produce the regulating current –If. In this embodiment, the input 23 of the adder A may be considered as the true input of the buffer and the current Ibi as the electrical quantity input into the buffer. The electrical output quantity is the voltage Vout.

In operation, the block 22 performs a measurement of the slope of the edge of the output signal and supplies it to the adder as a current If with the opposite sign to the sign of the input current Ibi. The resulting current Idr is applied to the low-pass filter 20, the output voltage of which is the input Vdr of the second inverter INV2. The circuit block 22 establishes a negative feedback that has the effect of stabilizing the slope of the edges of the output voltage and reducing its dependence on variations due to the process and to the supply and, partially, on variations due to the load and to the temperature.

Figure 3:
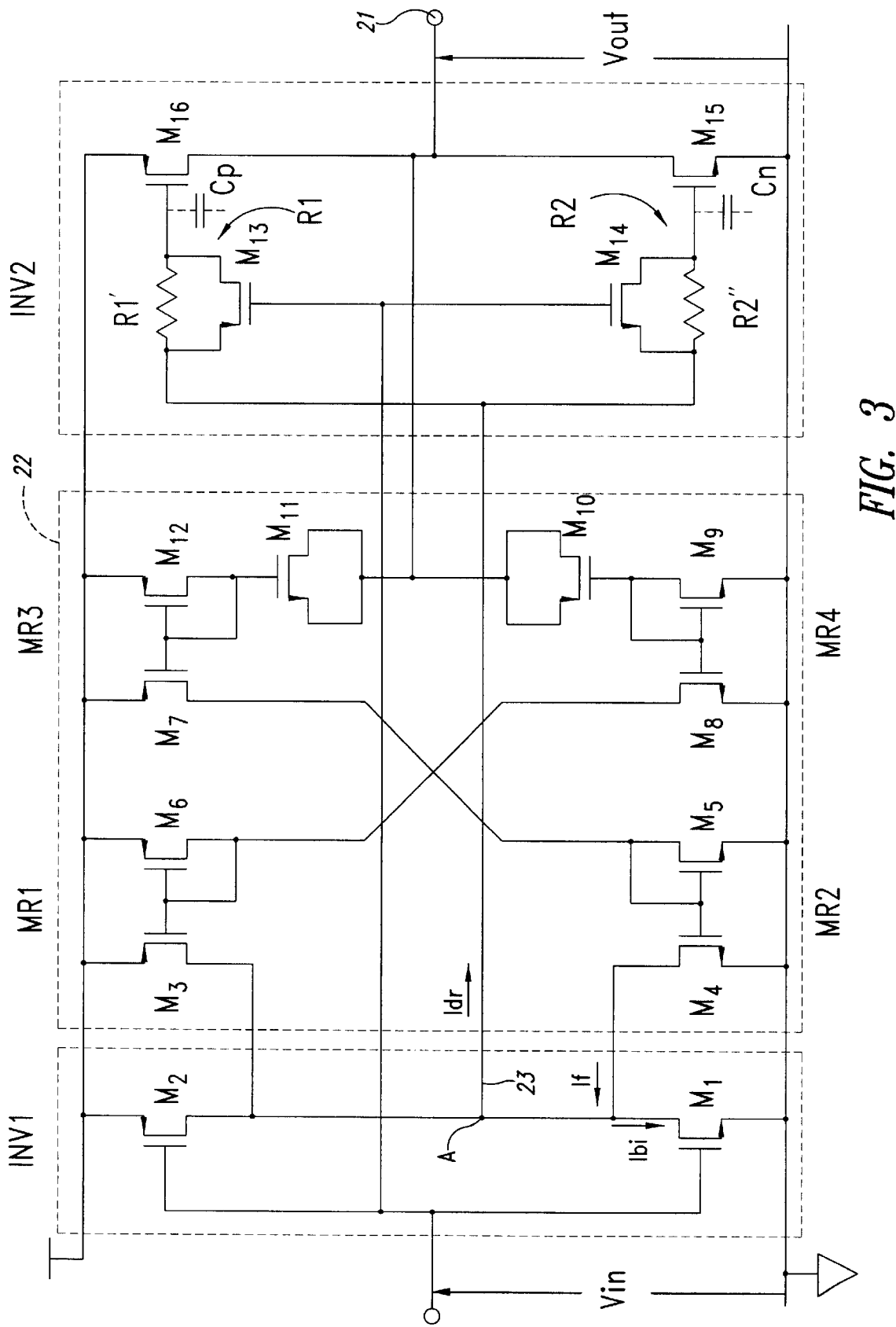
FIG. 3 is a circuit diagram of an output buffer according to the invention.

The circuit diagram of FIG. 3 shows a practical embodiment of the buffer according to the invention. Although a precise identification of the blocks of the diagram of FIG. 2 in the circuit diagram of FIG. 3 is not possible, for reasons which will become clear from the following description, various parts of the circuit are enclosed by broken lines and indicated by the symbols and the reference numbers used in FIG. 2 to show how the block diagram and the circuit diagram correspond.

The inverter INV1 is constituted by two complementary MOS transistors M1 (n-channel) and M2 (p-channel) which are connected between the supply terminals, indicated +VDD and by the ground symbol, and which have their gate electrodes connected together to the input terminal of the circuit and their drain electrodes connected together to the input 23 of the buffer.

The inverter INV2 is constituted by two complementary MOS transistors, that is, an n-channel MOS transistor M15 and a p-channel MOS transistor M16 connected in a push-pull arrangement between the supply terminals. The transistors M15 and M16 have their drain electrodes connected together to the output terminal 21 of the buffer and their gate electrodes connected to the input 23 of the buffer, each via a resistive unit identified R1, R2, respectively. The unit R1 is constituted by a resistor R1' and by a p-channel MOS transistor M13 connected in parallel with the resistor and the unit R2 is constituted by a resistor R2' and by an n-channel MOS transistor M14 connected in parallel with the resistor. The gate electrodes of the transistors M13 and M14 are connected together to the input of the inverter INV1.

It will be noted that, although the resistive units R1 and R2 are included in the block indicated as the inverter INV2, they form part of the low-pass filter indicated 20 in FIG. 2. The parasitic input capacitances Cp and Cn of the transistors M16 and M15, which also form part of the low-pass filter 20 (and correspond to the capacitor C of FIG. 2), are included in the same block.

The differentiating circuit 22 is constituted by two capacitive elements formed, in this embodiment, by the gate-channel capacitances of two MOS transistors, a p-channel MOS transistor M10 and an n-channel MOS transistor M11, and by two capacitance multipliers constituted by four current mirrors MR1, MR2, MR3, MR4 having a predetermined gain, for example, of 2, connected as shown in the diagram of FIG. 3.

In order to examine the operation of the circuit, a transition of the signal Vin from the low level to the high level will be considered. The transistor M1 of the inverter INV1 becomes conductive and the transistor M2 becomes non-conductive. In the inverter INV2 which is controlled by the output of the inverter INV1, on the other hand, the transistor M15 becomes non-conductive and transistor M16 becomes conductive. The output Vout of the inverter INV2, that is, the output of the buffer, has the same sign as the input Vin but the slope of the leading edge is less than that of the input signal because the switching of the transistor M16 of the inverter INV2 which changes from non-conduction to conduction, is slowed by the charging of the input capacitance Cp through the resistive element R1.

It will be noted that the resistance of the resistive element R1 depends on the conduction state of the transistor M13; in the embodiment described above, the gate electrode of the transistor M13 changes from a low level to a high level so that the transistor M13 becomes non-conductive and the resistance of the resistive element R1 is, in practice, that of the resistor R1'. At the same time, the transistor M14 of the resistive element R2, which is an n-channel transistor, is made conductive by the same signal which controls the transistor M13. The transistor M14 thus becomes conductive so that the resistance of the resistive element R2 is practically zero (the resistance of the transistor M14 when it is conductive); this has the effect of a rapid switching of the transistor M15 (from conduction to non-conduction) so that the effect of slowing of the transition of the signal from the low level to the high level caused by the charging of the capacitance Cp through the resistor R1' is not affected. The operation of the circuit when the signal Vin has a transition from the high level to the low level is exactly the same but with the opposite sign.

The operation of the negative feedback circuit 22 during a transition of the output signal will now be considered. During the transition, for example, from the low level to the high level, a current If of a magnitude dependent on the transition time is added, in the adding node A, to the input current Ibi supplied by one or other of the transistors M1, M2 of the inverter INV1 (in this example by M1). The sign of this current is always the opposite of that of the input current, owing to the crossed connection of the current mirrors. In particular, the current mirrors MR3 and MR2 constitute the path between the capacitance of M11 and the input and the current mirrors MR4 and MR1 constitute the path between the capacitance of M10 and the input.

Figure 1:
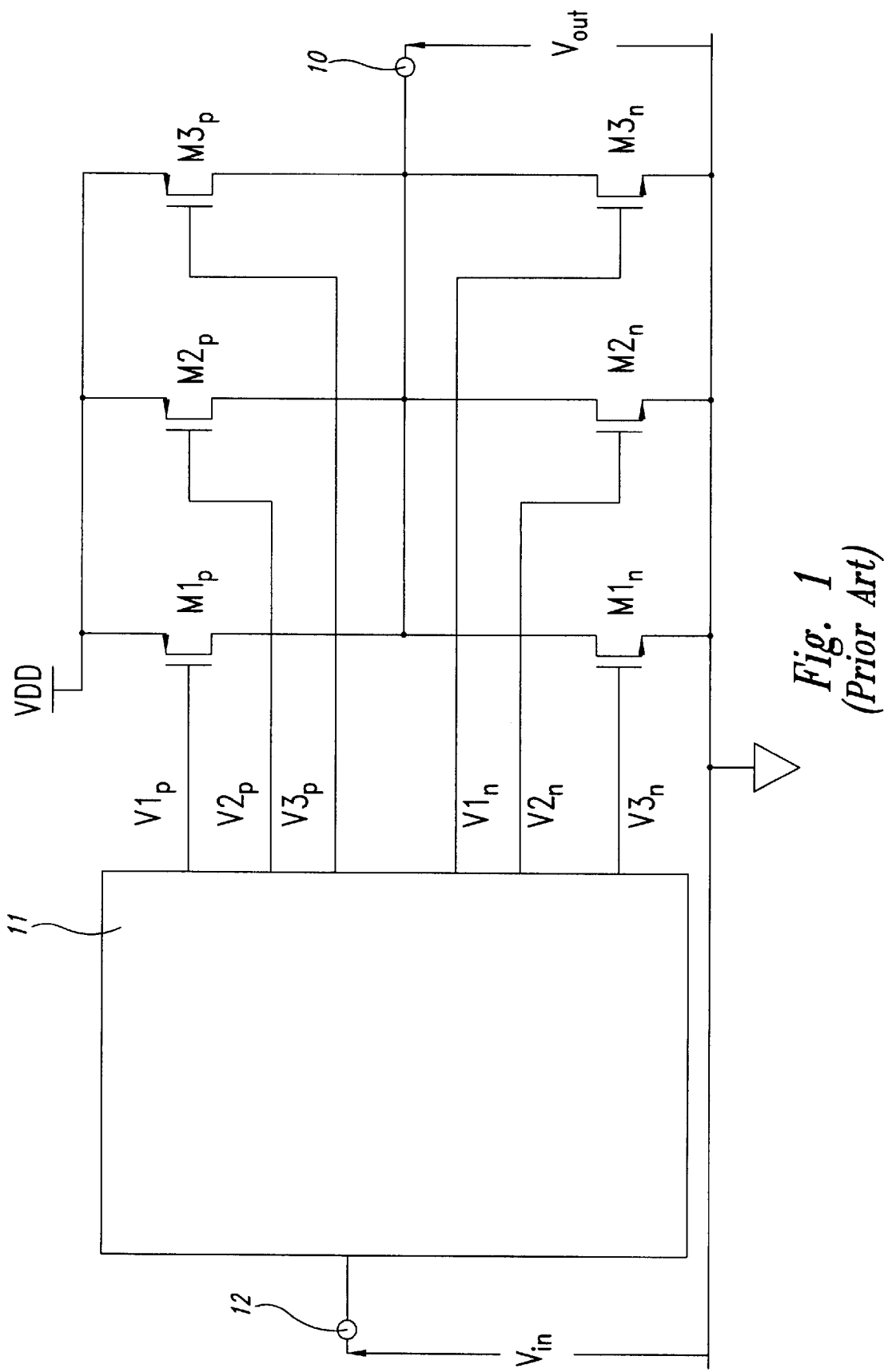
FIG. 1 is a circuit diagram of a known output buffer.

It has been found that the buffer according to the invention not only enables the slope of the edges of the digital signal to be regulated automatically and precisely, rendering it substantially independent of variations due to the process by which the integrated circuit is produced and to environmental operating conditions, but can also be produced in a smaller area than is required by a known buffer with known regulation, such as that shown in FIG. 1.

Although only one embodiment of the present invention has been described and illustrated, clearly many variations and modifications are possible within the scope of the same inventive concept. For example, resistors of constant resistance could be used instead of the resistive units R1 and R2, the resistance of which is dependent on the input signal, and true capacitors could be used instead of the capacitive units constituted by MOS transistors and capacitance multipliers. Thus the invention is to be limited only by the scope of the claims that follow and the equivalents thereof.

What is claimed is:

1. An output buffer for digital signals defined by transitions between two levels of an electrical input quantity applied as an input to the buffer, comprising: slope-variation means coupled in series with an input terminal of the buffer for modifying the slope of rising and falling input transitions and for generating an electrical output quantity corresponding to the electrical input quantity but having transition times longer than those of the electrical input quantity; and a negative feedback circuit comprising means for generating a regulating signal dependent on a slope of rising and falling transitions of the electrical output quantity, and means for applying the regulating signals to the input of the buffer.

2. The buffer of claim 1, in which the means for generating a regulating signal comprise a circuit that produces the time differential of the electrical output quantity, and the means for applying the regulating signals to the input of the buffer comprise an adder.

3. The buffer of claim 2, wherein the slope-variation means comprise a low-pass filter.

4. The buffer of claim 3, further comprising an inverter having two complementary MOS transistors connected in a push-pull arrangement between two supply terminals with their drain electrodes connected to an output terminal of the buffer and with their gate electrodes connected, via two respective resistive elements, to an input terminal of the buffer, and the low-pass filter comprising the resistive elements and the input capacitances of the two complementary MOS transistors.

5. The buffer of claim 4, wherein the circuit that produces the differential comprises capacitive means connected between the output terminal and the input terminal of the buffer.

6. The buffer of claim 5, wherein the capacitive means comprise two MOS transistors each connected so as to act as a capacitor, and two capacitance multipliers associated therewith.

7. The buffer of claim 6, wherein each of the two capacitance multipliers comprises two current mirrors.

8. The buffer of claim 4, wherein each of the two resistive elements comprise a resistor and a MOS transistor connected in parallel with the resistor, and wherein means are provided for controlling the conduction states of the MOS transistors in parallel with the resistors, in counterphase with one another and in synchronism with the electrical input quantity.

9. An output buffer for digital signals, comprising:
   an adder circuit having a first input coupled in series to an input terminal of the output buffer and a second input and an output;
   a low-pass filter having an input coupled in series to the output of the adder and an output, the low-pass filter configured to modify the slope of rising and falling input transitions; and
   a negative feedback circuit having an input coupled to an output node at the output of the low-pass filter and an output coupled to the second input of the adder, the negative feedback circuit configured to generate a regulating signal dependent on a slope of rising and falling transitions of an electrical output quantity at the output of the low-pass filter, and the adder configured to apply the regulating signal to an electrical input quantity received at the first input of the adder, the electrical output quantity generated at the output node corresponding to the electrical input quantity but having a longer transition time between two levels of the electrical input quantity.

10. The buffer of claim 9, wherein the negative feedback circuit comprises a regulating signal generator circuit configured to generate the regulating signal that is a time differential of the electrical output quantity.

11. The circuit of claim 10, wherein the regulating signal generation circuit comprises first and second MOS transistors each connected to act as a capacitor, and two capacitance multipliers coupled thereto.

12. The buffer of claim 11, wherein the two capacitance multipliers comprise first and second current mirrors.

13. The buffer of claim 9, further comprising an inverter coupled in series between the output of the low-pass filter and the output node.

14. A method of reducing the slope of a digital input signal, comprising:
   passing an electrical input quantity through a low-pass filter coupled in series with an input terminal to generate an electrical output quantity;
   processing the electrical output quantity through a negative feedback circuit to generate a regulating signal that is dependent on a slope of rising and falling transitions of the electrical output quantity; and
   applying the regulating signal to the electrical input quantity to modify the electrical output quantity at the output node to correspond to the electrical input quantity and to have a longer transition time between two levels of the electrical input quantity.

15. The method of claim 14, wherein generating the regulating signal comprises producing the time differential of the electrical output quantity.

16. The method of claim 15, further comprising passing the electrical output quantity from the low-pass filter through an inverter having complimentary MOS transistors connected in a push-pull arrangement between two supply terminals with their drain electrodes connected to an output node and with their gate electrodes connected, via two respective resistive elements, to an input terminal.

17. The method of claim 16, wherein each of the two resistive elements comprise a resistor and a MOS transistor connected in parallel with the resistor, and farther comprising controlling the conduction states of the MOS transistors in parallel with the resistors in counterphase with one another and in synchronism with the electrical input quantity.

18. An output buffer for digital signals defined by transitions between two levels of an electrical input quantity applied as an input to the buffer, comprising:
   a low-pass filter configured to generate an electrical output quantity corresponding to the electrical input quantity but having transition times longer than those of the electrical input quantity; and a negative feedback circuit comprising a circuit for generating a regulating signal dependent on the time variation of the electrical output quantity that comprises capacitive means connected between an output terminal and an input terminal of the buffer, and an adder for applying a time differential of the electrical output quantity to the input of the buffer; and an inverter having two complementary MOS transistors connected in a push-pull arrangement between two supply terminals with their drain electrodes connected to the output terminal of the buffer and with their gate electrodes connected, via two respective resistive elements, to the input terminal of the buffer.

19. An output buffer for digital signals defined by transitions between two levels of an electrical input quantity applied as an input to the buffer, comprising:
   a low-pass filter configured to generate an electrical output quantity corresponding to the electrical input quantity but having transition times longer than those of the electrical input quantity; and
   a negative feedback circuit comprising a circuit for generating a regulating signal dependent on the time variation of the electrical output quantity, the circuit comprising two MOS transistors connected to act as a capacitor and two capacitive multipliers associated therewith connected between an output terminal and an input terminal of the buffer, and an adder for applying the time differential of the electrical output quantity to the input of the buffer; and an inverter having two complementary MOS transistors connected in a push-pull arrangement between two supply terminals with their drain electrodes connected to the output terminal of the buffer and with their gate electrodes connected, via two respective resistive elements, to the input terminal of the buffer, and the low-pass filter comprising the resistive elements and the input capacitances of the two complementary MOS transistors.

20. An output buffer for digital signals defined by transitions between two levels of an electrical input quantity applied as an input to the buffer, comprising:

a low-pass filter configured to generate an electrical output quantity corresponding to the electrical input quantity but having transition times longer than those of the electrical input quantity; and a negative feedback circuit comprising a circuit for generating a regulating signal dependent on the time variation of the electrical output quantity that comprises two MOS transistors connected to act as a capacitor and two capacitance multipliers associated therewith comprising two current mirrors connected between an output terminal and an input terminal of the buffer, and an adder for applying a time differential of the electrical output quantity to the input of the buffer; and an inverter having two complementary MOS transistors connected in a push-pull arrangement between two supply terminals with their drain electrodes connected to the output terminal of the buffer and with their gate electrodes connected, via two respective resistive elements, to the input terminal of the buffer, and the low-pass filter comprising the resistive elements and the input capacitances of the two complementary MOS transistors.

21. An output buffer for digital signals defined by transitions between two levels of an electrical input quantity applied as an input to the buffer, comprising:

a slope variation circuit comprising a low-pass filter configured to generate an electrical output quantity corresponding to the electrical input quantity but having transition times longer than those of the electrical input quantity; a negative feedback circuit comprising a circuit for generating a regulating signal dependent on the time variation of the electrical output quantity and for producing a time differential of the electrical output quantity, and a circuit for applying the regulating signals to the input of the buffer comprising an adder; and an inverter having two complementary MOS transistors connected in a push-pull arrangement between two supply terminals with their drain electrodes connected to the output terminal of the buffer and with their gate electrodes connected, via two respective resistive elements, to an input terminal of the buffer, and the low-pass filter comprising the resistive elements and the input capacitances of the two complementary MOS transistors, and each of the two resistive elements comprising a resistor and a MOS transistor connected in parallel with the resistor, and means provided for controlling the conduction states of the MOS transistors in parallel with the resistors, in counter phase with one another and in synchronism with the electrical input quantity.

22. An output buffer, comprising:

an adder circuit having first and second inputs and an output;

a low-pass filter having an input coupled to the output of the adder and an output; and a negative feedback circuit having an input coupled to an output node at the output of the low-pass filter and an output coupled to the second input of the adder, the negative feedback circuit configured to generate a regulating signal dependent on a time variation of an electrical output quantity at the output of the low-pass filter, and an adder configured to apply the regulating signal to an electrical input quantity received at the first input of the adder, the electrical output quantity generated at the output corresponding to the electrical input quantity but having a longer transition time between two levels of the electrical input quantity, and the negative feedback circuit further comprising a regulating signal generator circuit configured to generate the regulating signal that is a time differential of the electrical output quantity, the regulating signal generation circuit comprising first and second MOS transistors each connected to act as a capacitor and two capacitance multipliers coupled thereto.

23. An output buffer, comprising:

an adder circuit having first and second inputs and an output;

a low-pass filter having an input coupled to the output of the adder and an output; and a negative feedback circuit having an input coupled to an output node at the output of the low-pass filter and an output coupled to the second input of the adder, the negative feedback circuit configured to generate a regulating signal dependent on a time variation of an electrical output quantity at the output of the low-pass filter, and an adder configured to apply the regulating signal to an electrical input quantity received at the first input of the adder, the electrical output quantity generated at the output corresponding to the electrical input quantity but having a longer transition time between two levels of the electrical input quantity, and the negative feedback circuit further comprising a regulating signal generator circuit configured to generate the regulating signal that is time differential of the electrical output quantity, the regulating signal generation circuit comprising first and second MOS transistors each connected to act as a capacitor and first and second current mirrors coupled thereto.

24. A method of reducing the slope of an input signal, comprising:

passing an electrical input quantity through a low-pass filter to generate an electrical output quantity;

processing the electrical output quantity through a negative feedback circuit to generate a regulating signal that is dependent on a time variation of the electrical output quantity and producing the time differential of the electrical output quantity;

applying the regulating signal to the electrical input quantity to modify the electrical output quantity at the output node to correspond to the electrical input quantity and to have a longer transition time between two levels of the electrical input quantity; and passing the electrical output quantity from the low-pass filter through an inverter having complementary MOS transistors connected in a push-pull arrangement between two supply terminals with their drain electrodes connected to an output node and with their gate electrodes connected, via two respective resistive elements, to an input terminal, each of the two resistive elements comprising a resistor and a MOS transistor connected in parallel with the resistor, and further comprising controlling the conduction states of the MOS transistors in parallel with the resistors in counter phase with one another and in synchronism with the electrical input quantity.

* * * * *